(12) United States Patent
Li

(10) Patent No.: US 12,206,429 B2
(45) Date of Patent: Jan. 21, 2025

(54) SWITCHED CAPACITOR CIRCUIT

(71) Applicant: INIVATION AG, Zürich (CH)

(72) Inventor: Chenghan Li, Zürich (CH)

(73) Assignee: INIVATION AG, Zürich (CH)

( * ) Notice: Subject to any disclaimer, the term of this patent is extended or adjusted under 35 U.S.C. 154(b) by 0 days.

(21) Appl. No.: 17/766,490

(22) PCT Filed: Sep. 30, 2020

(86) PCT No.: PCT/EP2020/077371
§ 371 (c)(1),
(2) Date: Apr. 4, 2022

(87) PCT Pub. No.: WO2021/069278
PCT Pub. Date: Apr. 15, 2021

(65) Prior Publication Data
US 2024/0056093 A1    Feb. 15, 2024

(30) Foreign Application Priority Data

Oct. 7, 2019  (EP) .................................... 19201664

(51) Int. Cl.
*H03M 1/12*  (2006.01)
*H03K 17/16*  (2006.01)
*H03K 17/687*  (2006.01)
*H03M 1/40*  (2006.01)

(52) U.S. Cl.
CPC .......... *H03M 1/403* (2013.01); *H03K 17/165* (2013.01); *H03K 17/687* (2013.01)

(58) Field of Classification Search
CPC .... H03M 1/403; H03K 17/165; H03K 17/687

USPC .......................................................... 341/172
See application file for complete search history.

(56) References Cited

U.S. PATENT DOCUMENTS

| | | | |
|---|---|---|---|
| 5,148,054 A | 9/1992 | Demler | |
| 5,479,121 A | 12/1995 | Shen et al. | |
| 5,923,206 A | 7/1999 | Levinson | |
| 6,734,713 B1 * | 5/2004 | Magoon | H03K 17/16 327/382 |
| 6,850,098 B2 | 2/2005 | Lee et al. | |
| 7,015,729 B1 | 3/2006 | Tursi et al. | |
| 7,663,424 B2 | 2/2010 | Stulik | |
| 7,728,269 B2 | 6/2010 | Lichtsteiner et al. | |

(Continued)

FOREIGN PATENT DOCUMENTS

| | | |
|---|---|---|
| JP | S64-42916 A | 2/1989 |
| WO | WO 2014/155635 A1 | 10/2014 |

*Primary Examiner* — Jean B Jeanglaude
(74) *Attorney, Agent, or Firm* — Christensen, Fonder, Dardi & Herbert PLLC

(57) ABSTRACT

A switched capacitor circuit, including a metal-oxide-semiconductor field-effect transistor-based switch comprising: a first metal-oxide-semiconductor field-effect transistor having a gate, a source and a drain, wherein the source is connected to a first node and the drain is connected to a second node or wherein the drain is connected to the first node and the source is connected to the second node; a second metal-oxide-semiconductor field-effect transistor having a gate, a source and a drain, wherein the source is connected to the drain and the source and the drain are together connected to the second node; a first capacitor connected between the first node and a third node; and a second capacitor connected between the second node and the third node.

22 Claims, 10 Drawing Sheets

(56) References Cited

U.S. PATENT DOCUMENTS

2016/0013782 A1  1/2016  Nakagawa
2018/0026580 A1* 1/2018  Zhang .................. H03B 5/1212
                                              327/543

* cited by examiner

SWITCHED CAPACITOR CIRCUIT

RELATED APPLICATIONS

The present application is a National Phase entry of PCT Application No. PCT/EP2020/077371, filed Sep. 30, 2020, which claims priority to European Patent Application No. 19201664.0, filed Oct. 7, 2019, the disclosures of which are hereby incorporated by reference herein in their entirety.

FIELD OF THE INVENTION

The invention relates to a switched capacitor circuit comprising metal-oxide-semiconductor field-effect transistors.

BACKGROUND OF THE INVENTION

Switched capacitor circuits are widely used in various analog and mixed-signal circuits, such as sample-and-hold circuits and analog-to-digital converters. The accuracy of switched capacitor circuits is often limited by charge injection and clock feedthrough introduced by the switch, which is made of a metal-oxide-semiconductor field-effect transistor (MOSFET or MOS). Charge injection occurs when the switch MOS is turned off, injecting its residual channel charge into its source and drain terminals. Clock feedthrough is an undesired capacitive coupling between the digital signal connected to the gate of the switch MOS and the analog signal at the source or drain of the switch MOS caused by its gate-source/gate-drain capacitance. Both charge injection and clock feedthrough cause errors in the analog signal at the source or drain terminal of the switch MOS.

There are several known techniques to try to address the impact of charge injection and clock feedthrough. These prior art solutions are described in the following with reference to FIGS. 1 to 4.

The circuit shown in FIG. 1A, not documented in print, uses a pair of complementary MOSFETs, consisting of an N type MOS (or NMOS) and a P type MOS (or PMOS) connected in parallel between two terminals or nodes T1 and T2. The two complementary MOSFETs and are controlled by two inverted signals S1 and S2. This circuit aims to let the charge injected by the NMOS cancel the charge injected by the PMOS when both are switched off at the same time. The effect of clock feedthrough is minimized by matching the gate-to-source/gate-to-drain capacitances between the NMOS and the PMOS. However, the amount of the charge injected by the NMOS and the PMOS each depend on the channel potential before both are switched off, as well as process variations. The matching of the gate-to-source/gate-to-drain capacitances between the NMOS and the PMOS is also subject to process variations. Therefore, the cancellation of the injected charge and the clock feedthrough is usually incomplete in practice.

The circuit shown in FIG. 1B, not documented in print, uses a single MOS as the switch and a dummy MOS that is about half the size of the switch MOS. The switch MOS and the dummy MOS are of the same type (i.e. NMOS or PMOS) but are controlled by inverted signals S1 and S2, where the first signal S1 controls the gate of the switch MOS and the second signal S2 controls the gate of the dummy MOS. Both the source and the drain terminals of the dummy MOS are connected to one terminal T2 of the switch MOS, where the injected charge shall be cancelled. As the switch MOS switches off, the dummy MOS switches on. Assuming exactly half of the channel charge of the switch MOS is injected to each of its source and drain terminals when it switches off, then the dummy MOS should be able to absorb exactly the amount of the injected charge when it switches on. If the switch MOS is twice as wide as the dummy MOS, the gate-source/gate-drain capacitance of one terminal of the switch MOS matches the gate-source/gate-drain capacitance of both terminals of the dummy MOS. Therefore, the effect of clock feedthrough of the switch MOS is cancelled by the dummy MOS. However, the assumption that exactly half of the channel charge of the switch MOS is injected to each of the terminals T1 or T2 when the switch MOS switches off is often invalid. Therefore, this circuit cannot ensure complete charge injection cancellation in practical situations.

In U.S. Pat. No. 5,479,121, a circuit shown in FIG. 2 consisting of a switch MOS, a dummy MOS, an inverter and three capacitors C1, C2, C3, is designed to compensate charge injection of the switch MOS. However, despite being relatively complex and power consuming, this compensation mechanism relies on the assumption that the partition of the channel charge of the switch MOS injected to each of its source and drain terminals T1 and T2 is identical to the partition of the channel charge of the dummy MOS. Because charge partition depends on the impedance ratio between two terminals of the MOS, this assumption is often invalidated in practice by differences in terminal impedance ratio between the switch MOS and the dummy MOS, resulting in incomplete charge injection compensation.

In U.S. Pat. No. 6,850,098, a circuit shown in FIG. 3 and method for nulling charge injection is proposed, comprising a switch MOS, two dummy MOS and two capacitors C1, C2. However, this circuit also relies on the assumption that the fraction of the channel charge injected by the switch MOS and absorbed by the nulling dummy MOS are equal. This assumption is again not guaranteed in practice, resulting in incomplete charge injection compensation.

In U.S. Pat. No. 7,663,424, a low charge injection and clock feedthrough two-switch circuit shown in FIG. 4, is described, comprising a coarse switch MOS and a fine switch MOS and an optional buffer circuit. The two-switch circuit switches on both the coarse switch MOS and the fine switch MOS for a coarse sample duration, and switches off the coarse switch MOS while keeping the fine switch MOS on to correct for the charge injection and clock feedthrough resulting from the coarse switch MOS. When the fine switch MOS is switched off, it still produces charge injection and clock feedthrough. By sizing the coarse switch MOS transistor and choosing the coarse sampling duration appropriately, the size of the fine switch MOS can be reduced. Thus, its charge injection and clock feedthrough can be lowered compared to using only the coarse switch MOS for the same sampling speed. However, this circuit relies on the assumption that the fine switch MOS can be sized sufficiently small to the extent that the charge injection and clock feedthrough from the fine switch MOS have an acceptably small impact. In practice, for compact designs, where a single MOS switch made of minimum size (allowed by the fabrication process) provides sufficient sampling speed, this circuit does not further reduce the charge injection and clock feedthrough of the minimum sized MOS switch.

SUMMARY

In summary, there is an unmet need for a practical and effective circuit design for cancelling switch charge injection and/or clock feedthrough in switched capacitor circuits. The circuit design should address and/or fulfill one, some or all of the following objectives: Effectively lower or cancel charge injection and/or clock feedthrough of a MOS switch, in particular of a small or minimum sized MOS switch, require low power consumption, require low complexity and/or a small chip area to realize the circuit.

These objectives are met according to the present invention by providing a switched capacitor circuit with the features of the claims.

When starting from the prior art MOSFET circuit solutions that rely on a dummy MOS to absorb and therefore compensate for the channel charge injected by the switch MOS, such as in the circuit shown in FIG. 1B, the basic idea underlying the present invention is that the partition or splitting ratio of the channel charge of the switch MOS during switching off depends on the impedance of both terminals T1 and T2. Therefore, unless the impedance on both sides of the switch are matched during switching off, such a circuit cannot achieve complete charge injection cancellation. Therefore, in the switched capacitor circuit according to the invention, the first node and the second node corresponding to the source and drain terminals of the switch MOS are connected to a common third terminal through known impedances, namely a first capacitor and a second capacitor, respectively.

Thus, according to the invention, the switched capacitor circuit comprises a metal-oxide-semiconductor field-effect transistor-based switch. The switch comprises a first metal-oxide-semiconductor field-effect transistor, which in the following might be abbreviated as MOS, and a second MOS. Of the first MOS, either the source or the drain is connected to a first node of the circuit and conversely either the drain or the source is connected to a second node of the circuit. In contrast, of the second MOS, the source is connected to the drain and the source and the drain are together connected to the second node. The first MOS may be regarded as a switch MOS, because it is responsible for the actual switching action between the first node and the second node, while the second MOS, which can be regarded as a dummy MOS, is short-circuited and has the function of cancelling the charge injection by absorbing the charge injected by the switch MOS when it turns off.

The small-signal ground, which may also be called the AC (alternating current) ground, may refer to any stable node that is immune to the AC signal of interest. This includes nodes such as the circuit ground node GND or the circuit supply voltage node VDD. Whenever herein it is demanded to match the impedance between a first node and a second node, it means that the impedance between the first node and the small-signal ground should be matched with the impedance between the second node and the small-signal ground.

Since the impedances of the two capacitors are known and freely pre-selectable, they may be chosen such that the corresponding total impedances between each of the first and second node and the small-signal ground are matched during the switching of the switch MOS. By properly selecting the values of the two capacitances, the impedance between the first node and the second node may be made negligible in comparison to any impedance between the first, second, or third node and the small-signal ground including any parasitic impedance at the first, second, or third node.

According to a preferred embodiment, the switched capacitor circuit is designed such that the gate of said first MOS receives a first gate signal and the gate of said second MOS receives a second gate signal, wherein the first gate signal and the second gate signal are formed such that the second MOS switches on after the first MOS is switched off. As explained above in connection with the prior art shown in FIG. 1B, having the second MOS switch on after the first MOS switches off leads to the portion of the channel charge that the first MOS injected into the second node upon switching off to be relatively predictable, hence making compensation by the second MOS more reliable.

According to a preferred embodiment, the switched capacitor circuit is designed such that the gate of said first MOS receives a first gate signal and the gate of said second MOS receives a second gate signal, which is the inverted first gate signal. In other words, the first gate signal and the second gate signal are complementary to each other, such that the second gate signal carries a logical one, when the first gate signal carries a logical zero and vice versa. One may obtain either the first or second gate signal by passing the other gate signal through an inverter circuit. Utilizing inverted gate signals has the effect that the second MOS is turned on when the first MOS is turned off, thus allowing the second MOS to absorb residual channel charge of the first MOS that is injected into the second node.

Preferably, there is a delay between a falling edge of the first gate signal and a rising edge of the second gate signal and/or between a rising edge of the first gate signal and a falling edge of the second gate signal. The rising edge of the second gate signal follows the falling edge of the first gate signal, when the two MOS are both of N type. The falling edge of the second gate signal follows the rising edge of the first gate signal, when the two MOS are both of P type. The delay may ensure that the first MOS is completely turned off and the charge injection is generated and partitioned before the second MOS is turned on to absorb the injected charge on the second node. In particular, the switched capacitor circuit may be designed such that the first gate signal has run through at least 50%, 70%, or 90% of the corresponding signal edge, be it the falling or the rising edge, before the second gate signal has run through at most 10%, 30%, or 50% of its corresponding signal edge, be it the rising or the falling edge. As an example, when the rising edge of the second gate signal is following the falling edge of the first gate signal, then advantageously, the first gate signal will have fallen by at least 90% before the second gate signal has risen up to 10% of its highest value.

Ideally, the channels of the first and second MOS have exactly or almost the same length, or a substantially equal length. However, the invention will also work, even if not perfectly, if the second MOS has a channel length, which is between 90% and 110%, or even between 75% and 125% of a channel length of the first MOS.

Preferably, the second MOS has a channel width, which is between 30% and 70%, or between 40% and 60%, of a channel width of the first MOS or which is substantially equal to half of a channel width of the first MOS. In connection with the channels of the two MOS having an approximately or substantially equal length, the channel of the second MOS having approximately or substantially half the width of the first MOS means that the second MOS can absorb approximately or substantially half the channel charge of the first MOS. When the first MOS is turned off, it will inject half of its channel charge to its source and the other half to its drain. Therefore, this embodiment will have the effect that the second MOS can absorb all of the channel charge injected into the second node.

According to an advantageous embodiment, a first capacitance of said first capacitor and a second capacitance of said second capacitor are in the same order of magnitude or substantially equal. That the first and second capacitances are in the same order of magnitude means in particular that they do not differ by more than a factor of 10. Preferably, the first and second capacitances only differ by a factor of five or two. More preferably, they differ in their value by less than 10% or 5%.

In a preferred embodiment, said first capacitor and/or said second capacitor has a capacitance or have capacitances of at least 10 fF, 32 fF, 100 fF or 320 fF. Higher capacitances have the advantage that the impedance between the first node and the second node become more negligible in comparison to any impedance between the first, second, or third node and the small-signal ground including any parasitic impedance at the first, second or third node. Any impedance values (including any parasitic impedances) mentioned herein and hereinafter are meant to refer to impedance determined at a gate signal frequency, which is the main frequency component of the gate signal provided to the gates of the MOS inside the circuit, such as the first and second switching signals provided to the first and second MOS.

According to a further preferred embodiment, said first capacitor and/or said second capacitor has a capacitance or have capacitances of at least 5 times, 10 times, 20 times, or 100 times of a first parasitic capacitance of the first node, of a second parasitic capacitance of the second node and/or of a third parasitic capacitance of the third node. It would be better still, if both the first and the second capacitor had capacitances that are at least 5, 10, 20, or 100 times greater than the largest value of the three parasitic capacitances. Each parasitic capacitance may be measured as a capacitance between the respective node and the small-signal ground.

Advantageously, the switched capacitor circuit is configured such that the second node or the third node is maintained at a virtual ground. This means in particular that the potential of this second node or third node is stable or fixed for signal frequencies lying within a predefined signal frequency range. This second node or third node may have a floating potential, when the signal frequency lies outside of said predefined signal frequency range.

According to a preferred embodiment, the switched capacitor circuit is configured as a sample-and-hold circuit, comprising an input buffer connected to the first node and a virtual ground buffer connected to the third node, whereby the second node is configured as an output of the sample-and-hold circuit. In this embodiment, an input signal to the sample-and-hold circuit is provided to the input terminal of the input buffer, while the input terminal of the virtual ground buffer is provided with a reference signal. Due to the virtual ground buffer, the third node is thus held at a virtual ground potential.

According to an alternative embodiment, the switched capacitor circuit may be configured as a capacitive feedback amplifier circuit, in particular for a delta modulator, comprising an input buffer connected to the third node and an amplifier and a third capacitor connected in parallel between the first node and the second node, wherein the second node is connected to the input of the amplifier and the first node is configured as an output of the capacitive feedback amplifier circuit. Here again the input buffer is provided with an input signal at its input terminal. In this configuration, the second node, which is connected to the input terminal of the amplifier, is operating at a virtual ground potential. The third capacitor is working as a feedback loop of the amplifier. The first MOS is working as the reset switch of the capacitive feedback amplifier.

Advantageously, for both the above-mentioned embodiments, the first capacitor and/or the second capacitor has a capacitance or have capacitances of at least 5 times, 10 times, 20, or 100 times the following value: $1/(2\cdot\pi\cdot f\cdot R)$. Here, f is a gate signal main frequency component of a gate signal supplied to the gate of the first and/or second MOS, while R is a small-signal node resistance at the first node, a small-signal node resistance at the third node, or the smaller of these two small-signal node resistances. The node resistance may in particular be measured between the respective node and the small-signal ground. As mentioned above, the small signal-ground includes the circuit ground GND and the circuit supply voltage node VDD, as these are stable nodes for a frequency range of interest.

If the switched capacitor circuit is configured as a sample-and-hold circuit as describe above, R may thus be a small-signal output resistance of said input buffer, a small-signal output resistance of said virtual ground buffer, or the smaller of these two small-signal output resistance values. On the other hand, if the switched capacitor circuit is configured as a capacitive feedback amplifier circuit as describe above, R may thus be a small-signal output resistance of said input buffer, a small-signal output resistance of said amplifier, or the smaller of these two small-signal output resistance values.

Preferably, the first MOS and the second MOS are of a same type, i.e. either configured as a NMOS or as a PMOS.

BRIEF DESCRIPTION OF THE DRAWINGS

Some examples of embodiments of the present invention will be explained in more detail in the following description with reference to the accompanying schematic diagrams, wherein.

DETAILED DESCRIPTION

Figure 1:
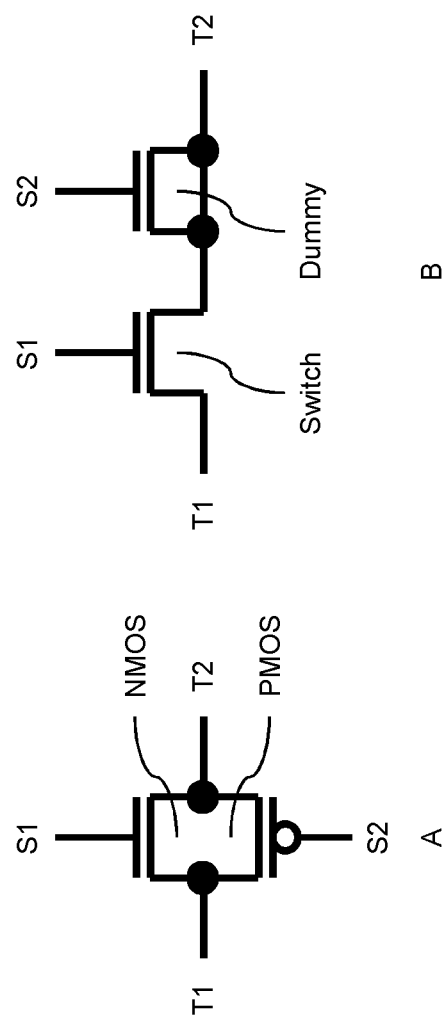
FIG. 1A shows a first MOSFET circuit for minimizing charge injection and clock feedthrough, according to prior art.
FIG. 1B shows a second MOSFET circuit for minimizing charge injection and clock feedthrough, according to prior art.
Figure 2:
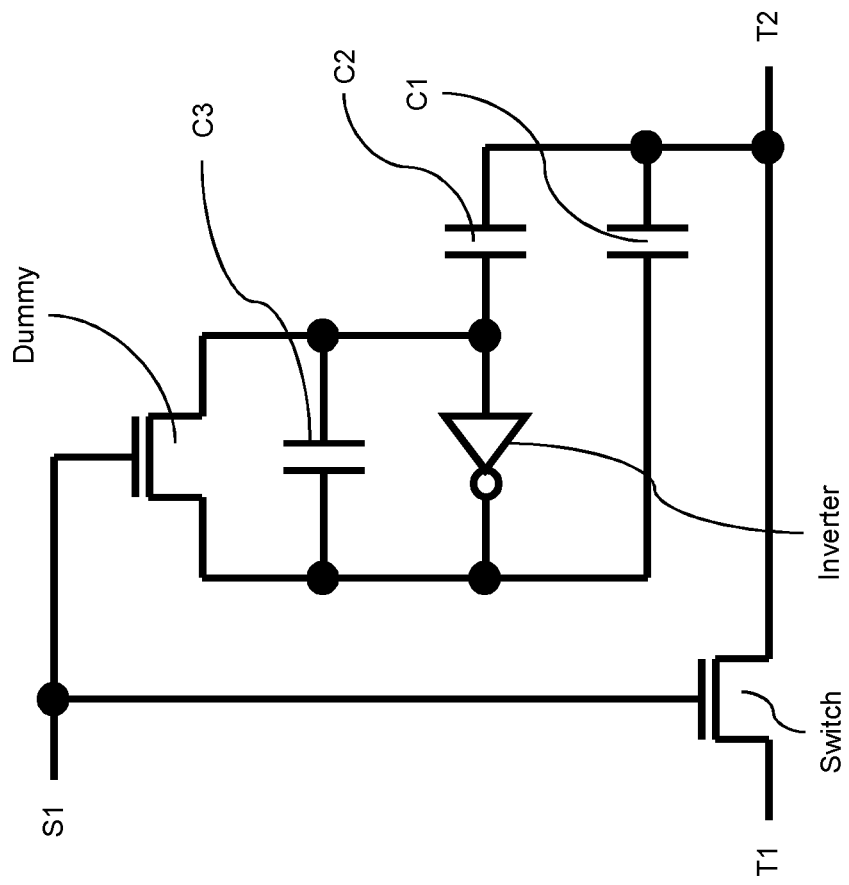
FIG. 2 shows a third MOSFET circuit for minimizing charge injection and clock feedthrough, according to prior art.
Figure 3:
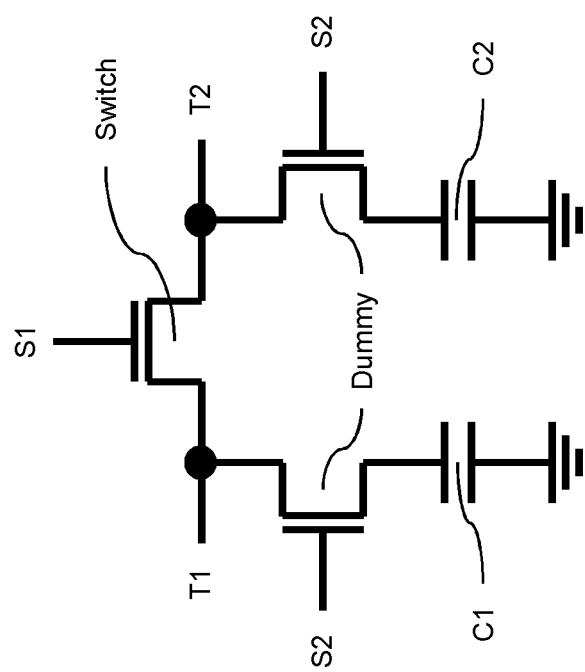
FIG. 3 shows a fourth MOSFET circuit for minimizing charge injection and clock feedthrough, according to prior art.
Figure 4:
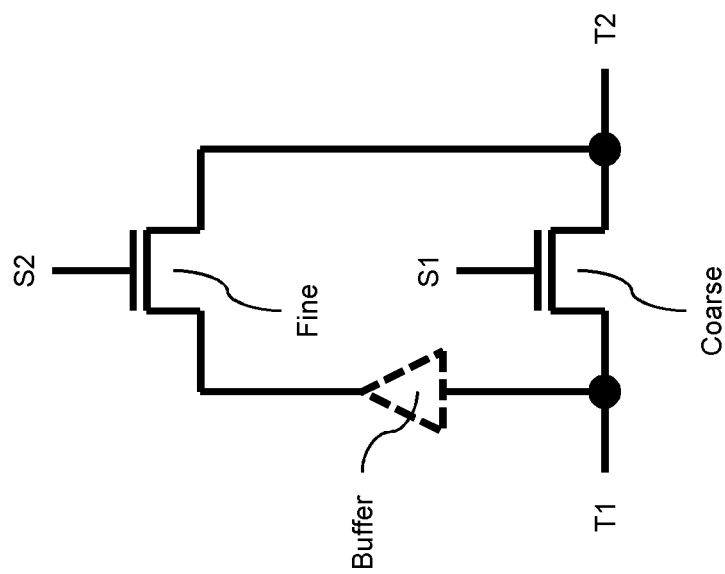
FIG. 4 shows a fifth MOSFET circuit for minimizing charge injection and clock feedthrough, according to prior art.
Figure 5:
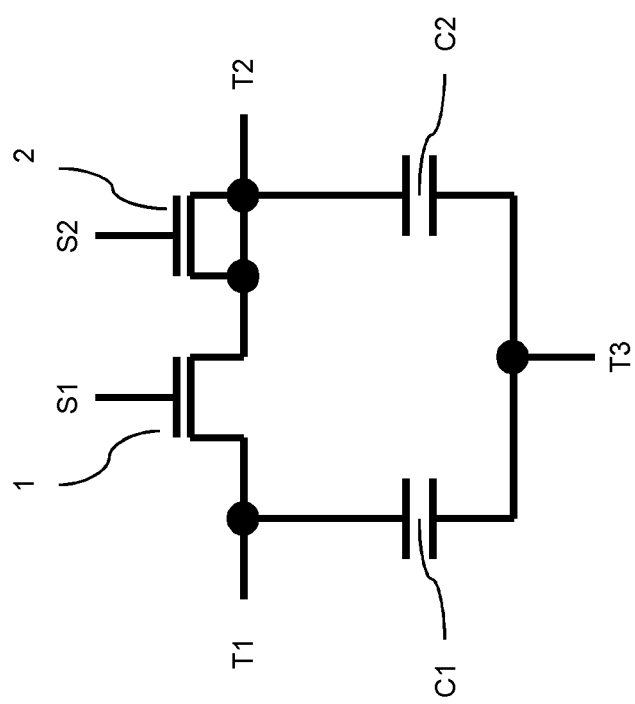
FIG. 5 shows a MOSFET-based switch, according to one preferred embodiment.

FIG. 5 shows a metal-oxide-semiconductor field-effect transistor-based switch, according to a preferred embodiment. The switch comprises first metal-oxide-semiconductor field-effect transistor 1 (in the following just MOS for short), a second MOS 2, a first capacitor C1, and a second capacitor C2. The first MOS 1, acting as a switch MOS, connects a first node T1 to a second node T2. Either the source or the drain of the first MOS 1 may be connected to the first node T1, so that the other terminal is connected to the second node T2. The second MOS 2, acting as a dummy MOS, has its source connected to its drain and both connected to only the second node T2. The first MOS 1 and the second MOS 2 are of the same type, but are controlled by inverted signals S1 and S2. The first MOS 1 and second MOS 2 can be either N or P type, while only N type is shown as an example hereafter. The second MOS 2 is half the size in terms of the channel area of the first MOS 1. In particular, the second MOS 2 has the same channel length as the first MOS 1, but half the channel width of the first MOS 1. The first node T1 is connected to a third node T3 via the first capacitor C1, while the second node T2 is connected to the third node T3 via the second capacitor C2.

The functioning principle of the switch shown in FIG. 5 will in the following be explained in connection with two different switched capacitor circuits, shown in the FIGS. 6 and 9.

Figure 6:
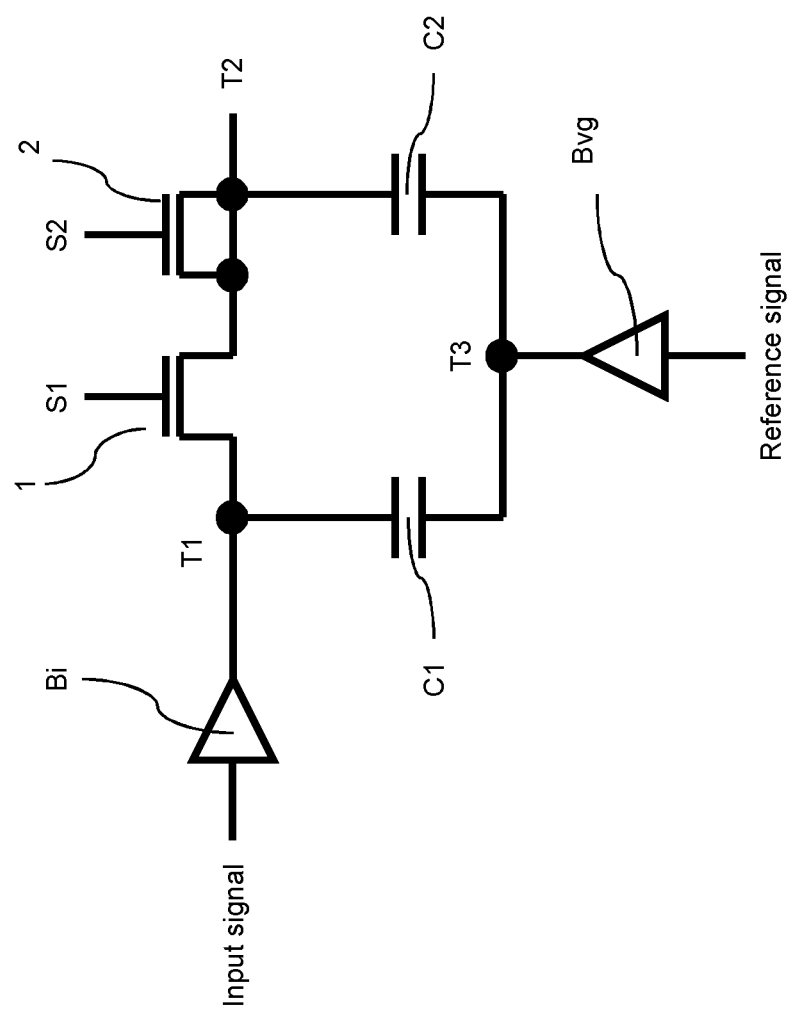
FIG. 6 shows the switch of FIG. 5 embedded in a switched capacitor circuit, which is configured as a sample and hold circuit.

FIG. 6 shows a switched capacitor circuit, which is configured as a sample and hold circuit. It may be viewed as a general-purpose sample and hold circuit, where the input signal is supplied to the first node T1 through an input buffer Bi and the output signal is supplied at the second node T2 that samples and holds the analog signal on the second capacitor C2. The third node T3 is the virtual ground terminal driven by a virtual ground buffer Bvg connected to a steady reference signal. Both the input buffer Bi and the virtual ground buffer Bvg are analog buffers.

The input buffer Bi has a small-signal output resistance of R1:

$$R1 = \left(\frac{V_{AP}}{I_{DS1}}\right) \Big\| \left(\frac{V_{AN}}{I_{DS1}}\right)$$

Here $V_{AP}$ and $V_{AN}$ are the early voltage values of the NMOS and the PMOS inside the input buffer Bi that drive the first node T1, $I_{DS1}$ is the drain-source current of the NMOS and the PMOS inside the input buffer Bi that drive the first node T1. $\|$ is the operator for calculating a total resistance or impedance value of two resistances or impedances connected in parallel.

Similarly, the virtual ground buffer Bvg has a small-signal output resistance of R2:

$$R2 = \left(\frac{V_{AP}}{I_{DS2}}\right) \Big\| \left(\frac{V_{AN}}{I_{DS2}}\right)$$

Here $V_{AP}$ and $V_{AN}$ are the early voltage values of the NMOS and the PMOS inside the virtual ground buffer Bvg that drive the third node T3, $I_{DS2}$ is the drain-source current of the NMOS and the PMOS inside the virtual ground buffer Bvg that drive the third node T3.

The main frequency component of the first and second switching signals S1 and S2 connected to the gates of the first MOS 1 and the second MOS 2 is f. Therefore, the main frequency component of the charge injected by the first MOS 1 is also f. For the injected charge, the small-signal impedance of the first capacitor C1 is Z1 and the small-signal impedance of the second capacitor C2 is Z2 (here i stands for 1 or 2, and Ci stands for the corresponding capacitance of the first or second capacitor C1, C2):

$$Zi = \frac{1}{2 \cdot \pi \cdot f \cdot Ci}$$

Figure 7:
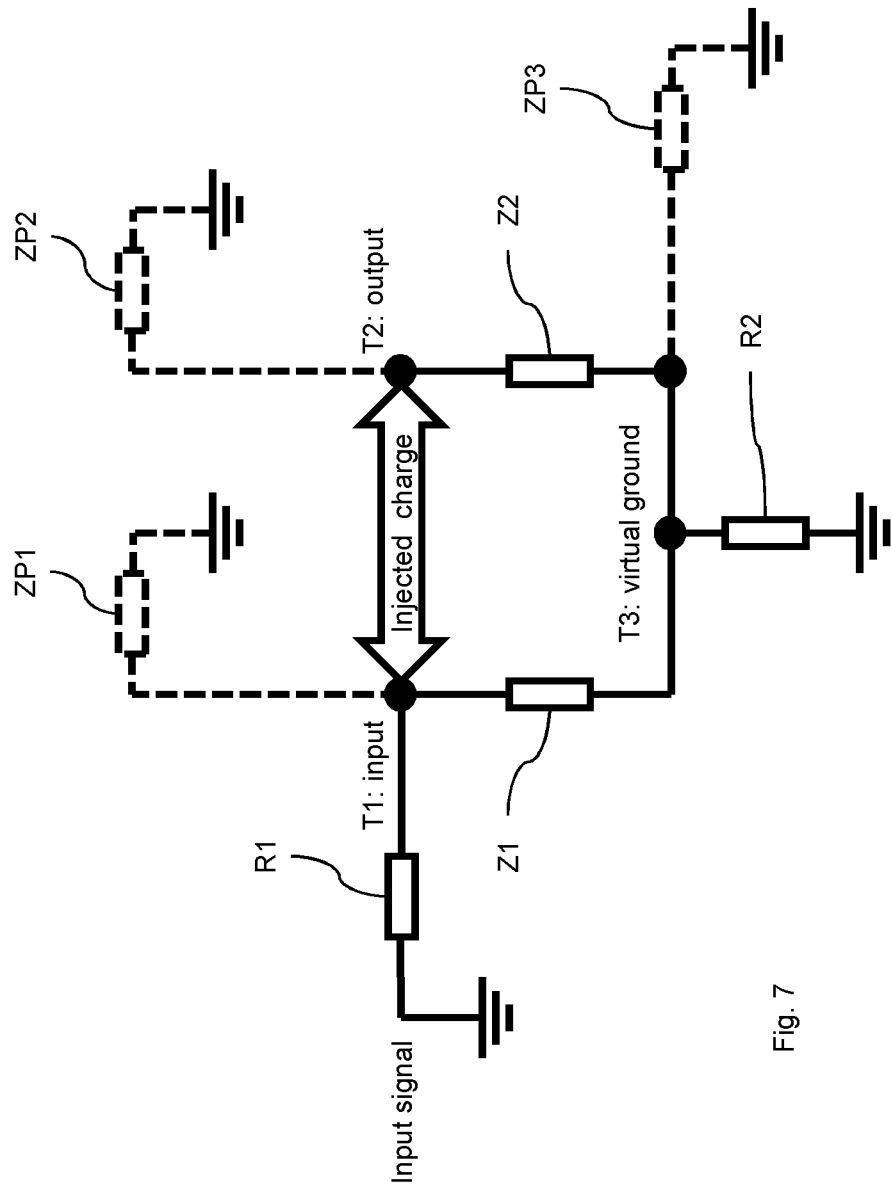
FIG. 7 shows a small-signal equivalent circuit of the switched capacitor circuit shown in FIG. 6 for an injected charge.

The small-signal equivalent circuit for the injected charge is shown in FIG. 7. The parasitic impedance ZP1, ZP2, or ZP3 (drawn with dashed lines) is the corresponding parasitic impedance between the first, second, or third node T1, T2, or T3 and the small-signal ground, respectively. They are caused by equivalent total parasitic capacitances CP1, CP2, CP3 between each of the three nodes T1, T2, T3 and the small-signal ground (here, i stands for 1, 2, or 3):

$$ZPi = \frac{1}{2 \cdot \pi \cdot f \cdot CPi}$$

The desired values of the capacitances for the first and second capacitors C1 and C2 can be determined by two conditions. The first condition is that the values of Z1 and Z2 must be less than $\frac{1}{10}$ (one tenth) of each of the values ZP1, ZP2, and ZP3. Hence, each of the capacitances, which are herein also denoted with C1 and C2, should fulfill the following constraint, where max(CP1, CP2, CP3) represents the largest of the three capacitance values CP1, CP2, and CP3 (here i stands for 1 or 2):

$$Ci > 10 \cdot \max(CP1, CP2, CP3)$$

In practice, the parasitic capacitance values of CP1, CP2, CP3 are themselves influenced by the capacitance values C1 and C2. The two capacitors C1 and C2 are typically built as metal-insulator-metal (MIM) capacitors or metal-oxide-metal (MOM) capacitors. In general, if the values of C1 and C2 are less than 10 fF, the minimum capacitance values of CP1, CP2, CP3 are approximately in the range of 1 fF. Therefore, the values C1 and C2 usually should be at least 10 fF. The values of CP1, CP2, CP3 increase with the values of C1 and C2. By proper layout design, the value of CP1, CP2, CP3 can be kept to less than $\frac{1}{10}$ of the values of C1 and C2. Therefore, the impedances Z1 and Z2 are kept to less than $\frac{1}{10}$ of the parasitic impedances ZP1, ZP2, ZP3 by a proper layout design of the capacitors C1 and C2.

Furthermore, the second condition is that the values Z1 and Z2 must also be less than $\frac{1}{10}$ of R1 and R2. For low-power sample-and-hold circuits, $I_{DS1}$ and $I_{DS2}$ usually range between 1 nA and 1 mA. Assuming $V_{AP}$ and $V_{AN}$ are both 10V, then R1 and R2 usually range between 5 kOhm and $5 \times 10^9$ Ohm. If $I_{DS1}$ and $I_{DS2}$ are about 1 mA, then R1 and R2 are about 5 kOhm. Thus, the respective C1 and C2 constraint can be determined by the following formula, where min(R1, R2) represents the smaller of R1 and R2, and f is usually 10 GHz, which means that the switching signals S1 and S2 have rise and fall times of about 100 ps (here i stands for 1 or 2):

$$Ci > \frac{10}{2 \cdot \pi \cdot f \cdot \min(R1, R2)}$$

Therefore, if $I_{DS1}$ and $I_{DS2}$ are both about 1 mA, C1 and C2 should be at least 32 fF. If $I_{DS1}$ and $I_{DS2}$ are about 1 nA, R1 and R2 are about 5×10⁹ Ohm. In this case, the second condition only requires C1 and C2 to be larger than 3.2×10⁻²⁰ F.

Overall, the above two conditions require that for low-power sample-and-hold circuits with $I_{DS1}$ and $I_{DS2}$ ranging between 1 nA and 1 mA, C1 and C2 should be at least 32 fF. However, it is desirable that the above two conditions are not only met, but also exceeded to provide better charge injection cancellation performance (this is explained in more detail further below). For example, better charge injection cancellation can be achieved if Z1 and Z2 are less than 1/100 of ZP1, ZP2, ZP3 as well as R1 and R2, by choosing C1 and C2 to be at least 320 fF and keeping CP1, CP2, CP3 at less than 3.2 fF.

As a non-restricting example, assuming $V_{AP}$ and $V_{AN}$ are both 10V and f is 10 GHz, the following values can be chosen: $I_{DS1}$ is 1 μA, $I_{DS2}$ is 10 μA, so that R1 is 5 MOhm, R2 is 500 kOhm, R1 is larger than R2; C1 and C2 are both 100 fF, so that Z1 and Z2 are both about 160 Ohm, less than 1/1000 of R1 and R2. And CP1, CP2, and CP3 are kept less than 5 fF by the layout design, so that Z1 and Z2 are 20 times smaller than each of ZP1, ZP2, and ZP3.

During the sample phase, the first MOS 1 is on and the second MOS 2 is off. If both the first MOS 1 and the second MOS 2 are of N type, then the gate of the first MOS 1 is at a high voltage (S1=VDD) and the gate of the second MOS 2 is at a low voltage (S2=GND). If both the first MOS 1 and the second MOS 2 are of P type, then the gate of the first MOS 1 is at a low voltage (S1=GND) and the gate of the second MOS 2 is at a high voltage (S2=VDD). Therefore, in the sampling phase, the second node T2, which functions as the output terminal, is connected to the first node T1, which functions as the input terminal, and follows any input signal within the bandwidth of the input buffer (Bi).

To end the sample phase and enter the hold phase, the first MOS 1 is turned off and then the second MOS 2 is turned on. If both the first MOS 1 and the second MOS 2 are of N type, then the gate of the first MOS 1 transitions from a high voltage (S1=VDD) to a low voltage (S1=GND) and then the gate of the second MOS 2 transitions from a low voltage (S2=GND) to a high voltage (S2=VDD). If both the first MOS 1 and the second MOS 2 are of P type, then the gate of the first MOS 1 transitions from a low voltage (S1=GND) to a high voltage (S1=VDD) and then the gate of the second MOS 2 transitions from a high voltage (S2=VDD) to a low voltage (S2=GND).

When the first MOS 1 transitions from on state to off state, its residual channel charge is injected into both the first node T1 and the second node T2. For the injected charge, the total impedance between the first node T1 and the small-signal ground is ZT1 and the total impedance between the second node T2 and the small-signal ground is ZT2. Because both Z1 and Z2 are much smaller than R1, R2 and each of ZP1, ZP2 and ZP3, the following relationships hold: ZT1≈ZT2≈R1∥R2∥ZP1∥ZP2∥ZP3.

The tolerance of this approximate equality depends on the margin by which the design exceeds the previously mentioned two conditions that determine the constraints on C1 and C2. For example, if Z1 and Z2 are about 1/10 of ZP1, ZP2, ZP3, as well as R1 and R2, ZT1 may be different from ZT2 by 10%; whereas if Z1 and Z2 are about 1/100 of ZP1, ZP2, ZP3 as well as R1 and R2, ZT1 may be different from ZT2 by only 1%.

If ZT1 and ZT2 are approximately equal as seen by the residual channel charge of the first MOS 1, approximately half of the residual channel charge of the first MOS 1 is injected into each of the first node T1 and the second node T2.

Figure 8:
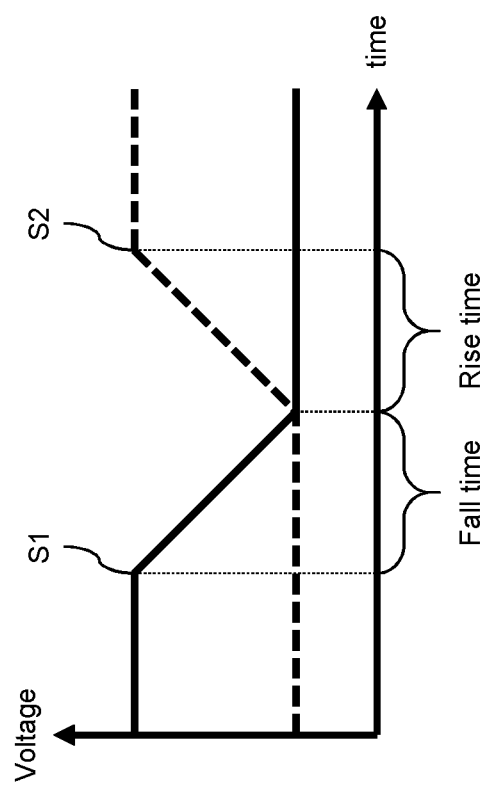
FIG. 8 shows the gate signals provided to the first and second MOS and their corresponding rise and fall times.

Immediately after the first MOS 1 is turned off, the second MOS 2 starts transitioning from off state to on state as shown in FIG. 8, which shows a first gate signal S1 driving the gate of the first MOS 1 as a solid line and a second gate signal S2 driving the gate of the second MOS 2 as a dashed line. As described above, approximately half of the residual channel charge of the first MOS 1 is injected into the second node T2. Because the second MOS 2 has half the channel area of the first MOS 1, the channel of the second MOS 2 absorbs half of the residual channel charge of the first MOS 1 during the transition of the second MOS 2 from off state to on state. Therefore, after the second MOS 2 is turned on, the charge injected into the second node T2 by the first MOS 1 is approximately fully absorbed by the second MOS 2, achieving effective charge injection cancellation on the output terminal of the circuit. The bigger the margin by which the design exceeds the previously mentioned two conditions that determine the values of C1 and C2, the more effective the charge injection cancellation is.

Furthermore, because the channel width of the second MOS 2 is half of that of the first MOS 1, the total capacitance between the gate of the second MOS 2 and the second node T2, which is the sum of the gate-source capacitance and the gate-drain capacitance, approximately equals the gate-to-source (or the gate-to-drain, depending on whether the source or the drain of the first MOS 1 is connected to second node T2) capacitance between the first MOS 1 gate and the second node T2. Therefore, the clock feedthrough effect from the first MOS 1 gate signal S1 and the second MOS 2 gate signal S2 also effectively cancel each other on the second node T2.

Charge injection and clock feedthrough effects on the first node T1 are not of concern, because the first node T1 as the input terminal is driven and hence can eventually overcome these charge injection and clock feedthrough effects. During the hold phase, the first MOS 1 is off and the second MOS 2 is on. The output terminal at the second node T2 holds its voltage signal. R1 is designed to be larger than R2, which means $I_{DS2}$ is larger than $I_{DS1}$, hence the virtual ground buffer Vbg has larger driving strength and higher bandwidth than the input buffer Bi. Thus, the second node T2 is effectively isolated from the first node T1.

At the transition from the hold phase to the sample phase, the charge injection and clock feedthrough effects on both the first node T1 and the second node T2 are not of concern, because both the first node T1 and the second node T2 are driven in the sample phase and hence can eventually overcome the charge injection and clock feedthrough effects.

Single-input capacitive feedback amplifier circuits are used in delta modulator analog-to-digital converters. In the patent publication U.S. Pat. No. 7,728,269B2, titled "Photoarray for detecting time-dependent image data", a capacitive feedback amplifier was used to encode a light intensity-dependent analog signal using delta modulation in each photo-sensing pixel. The capacitive feedback amplifier amplifies the difference in the analog signal since a previous reset. The reset switch resets the capacitive feedback amplifier and sets the new reference level to the current analog signal value. However, in practice, the reset switch made of a single MOS introduces charge injection and clock feedthrough whenever it switches off at the end of the reset period. The injected charge and clock feedthrough drive the capacitive feedback amplifier output to deviate from its reset level, leading to significant inaccuracies in the subsequent quantization stage.

Figure 9:
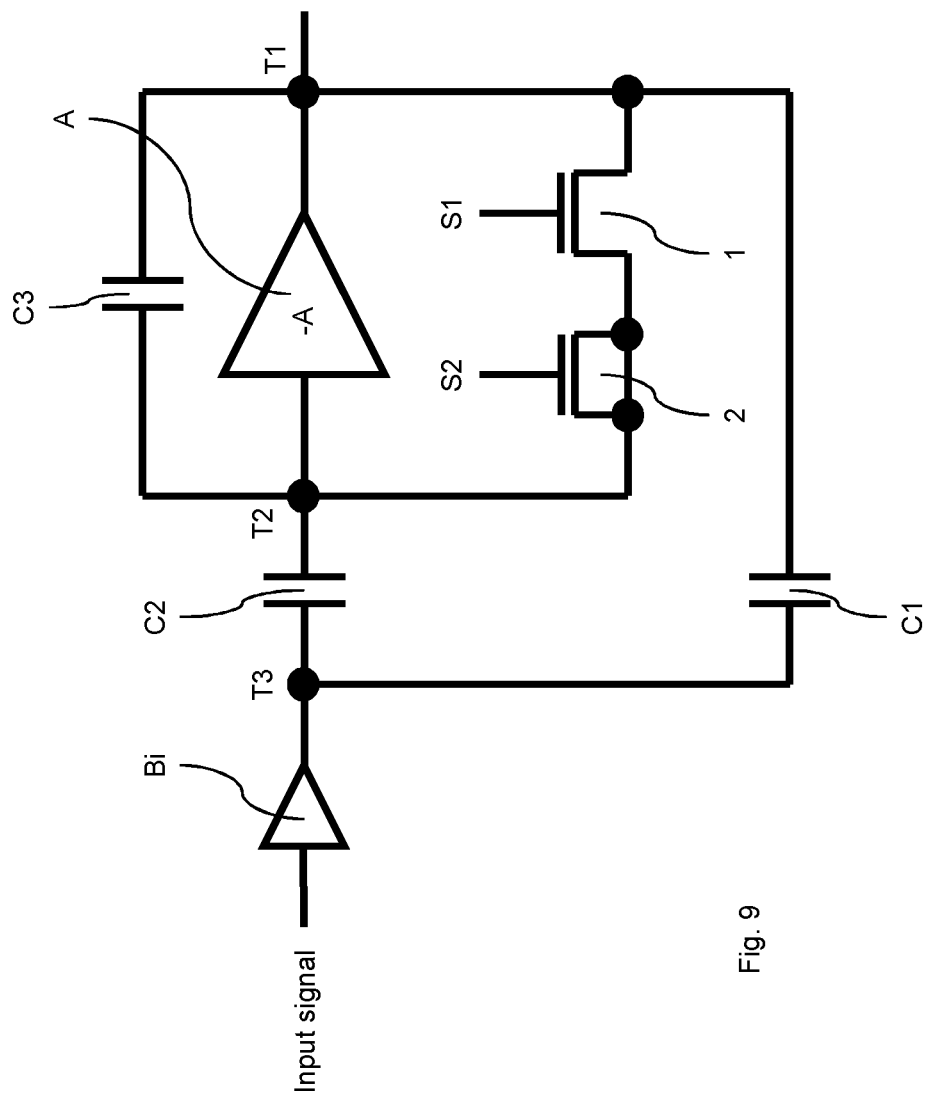
FIG. 9 shows the switch of FIG. 5 embedded in a switched capacitor circuit, which is configured as a capacitive feedback amplifier circuit.

FIG. 9 shows a switched capacitor circuit, which is configured as a capacitive feedback amplifier circuit. In this configuration, the first node T1 acts as an output terminal, connected to the output of the capacitive feedback amplifier. The third node T3 acts as an input terminal, driven by an input buffer Bi, which is an analog buffer, connected to the input signal. The second node T2 acts as a virtual ground terminal connected to the input of an amplifier A.

The input buffer Bi has a small-signal output resistance of R1:

$$R1 = \left(\frac{V_{AP}}{I_{DS1}}\right) \| \left(\frac{V_{AN}}{I_{DS1}}\right)$$

Here $V_{AP}$ and $V_{AN}$ are the early voltage values of the NMOS and the PMOS inside the input buffer Bi that drive the third node T3, $I_{DS1}$ is the drain-source current of the NMOS and the PMOS inside the input buffer Bi that drive the third node T3. As always, $\|$ is the operator for calculating a total resistance or impedance value of two resistances or impedances connected in parallel.

The amplifier A has a small-signal output resistance of R2:

$$R2 = \left(\frac{V_{AP}}{I_{DS2}}\right) \| \left(\frac{V_{AN}}{I_{DS2}}\right)$$

Here $V_{AP}$ and $V_{AN}$ are the early voltage values of the NMOS and the PMOS inside the amplifier A that drive the first node T1, $I_{DS2}$ is the drain-source current of the NMOS and the PMOS inside the amplifier A that drive the first node T1.

The main frequency component of the switching signals S1 and S2 connected to the gates of the first MOS 1 and the second MOS 2 is f, therefore, the main frequency component of the injected charge is also f. For the injected charge, the small-signal impedance of the first capacitor C1 is Z1, the small-signal impedance of the second capacitor C2 is Z2, and the small-signal impedance of the third capacitor C3 is Z3 (here i stands for 1, 2 or 3, and Ci stands for the corresponding capacitance of the first, second or third capacitor C1, C2 or C3):

$$Zi = \frac{1}{2 \cdot \pi \cdot f \cdot Ci}$$

Figure 10:
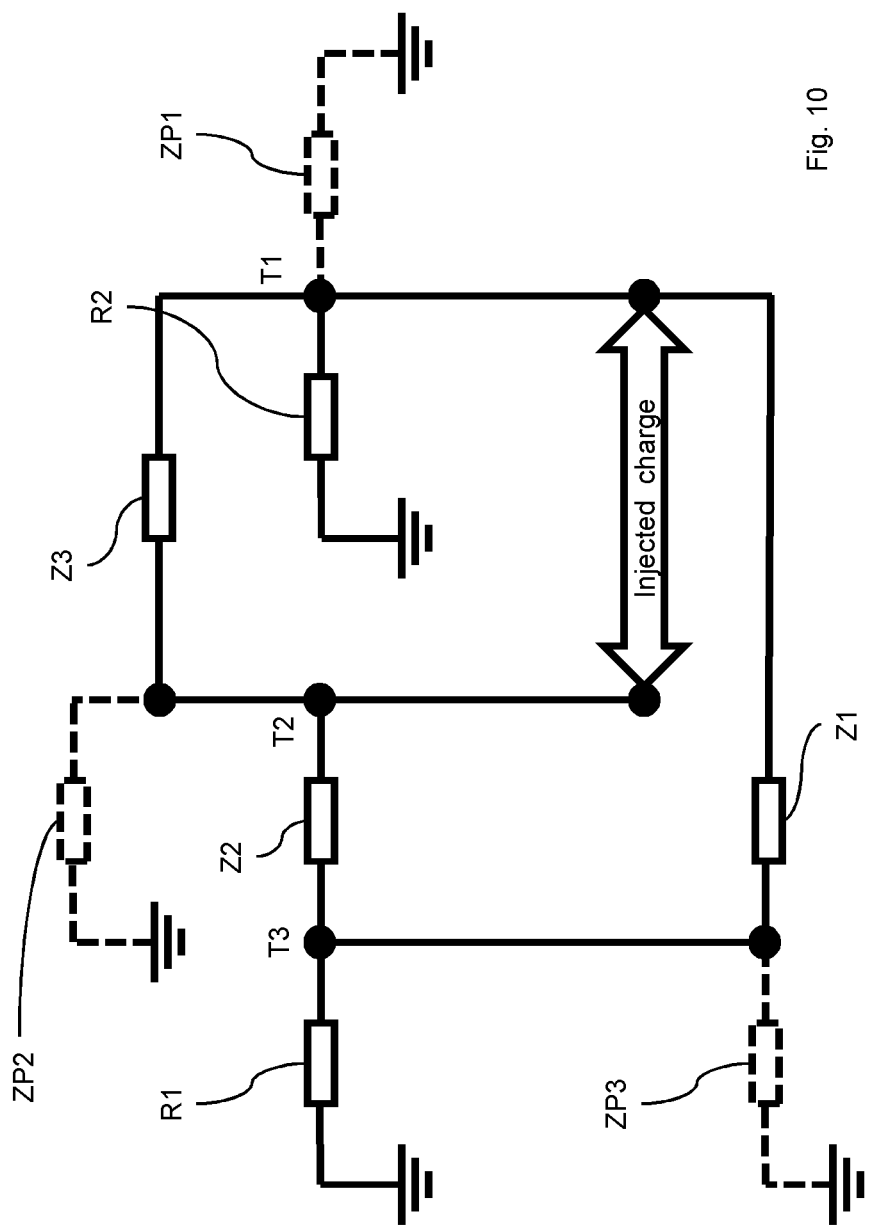
FIG. 10 shows a small-signal equivalent circuit of the switched capacitor circuit shown in FIG. 9 for an injected charge.

The small-signal equivalent circuit for the injected charge is shown in FIG. 10. The parasitic impedance ZP1, ZP2, or ZP3 (drawn with dashed lines) is the corresponding parasitic impedance between the first, second or third node T1, T2, or T3 and the small-signal ground, respectively. They are caused by the equivalent total parasitic capacitance CP1, CP2, CP3 between each of the three nodes T1, T2, T3 and the small-signal ground (here, i stands for 1, 2, or 3):

$$ZPi = \frac{1}{2 \cdot \pi \cdot f \cdot CPi}$$

The desired values of the capacitances for the first and second capacitors C1 and C2 can be determined by two conditions. The first condition is that the values of Z1 and Z2 must be less than $\frac{1}{10}$ of each of the values ZP1, ZP2, and ZP3. Hence, each of the capacitances, which are herein also denoted with C1 and C2, should fulfill the following constraint, where max(CP1, CP2, CP3) represents the largest of the three capacitance values CP1, CP2, and CP3 (here i stands for 1 or 2):

$$Ci > 10 \cdot \max(CP1, CP2, CP3)$$

In practice, the parasitic capacitance values of CP1, CP2, CP3 are themselves influenced by the capacitance values C1 and C2. The two capacitors C1 and C2 are typically built as metal-insulator-metal (MIM) capacitors or metal-oxide-metal (MOM) capacitors. In general, if the values of C1 and C2 are less than 10 fF, the minimum capacitance values of CP1, CP2, CP3 are approximately in the range of 1 fF. Therefore, the values C1 and C2 usually should be at least 10 fF. The values of CP1, CP2, CP3 increase with the values of C1 and C2. By proper layout design, the value of CP1, CP2, CP3 can be kept to less than $\frac{1}{10}$ of the values of C1 and C2. Therefore, the impedances Z1 and Z2 are kept to less than $\frac{1}{10}$ of the parasitic impedances ZP1, ZP2, ZP3 by a proper layout design of the capacitors C1 and C2.

Furthermore, the second condition is that the values Z1 and Z2 must also be less than $\frac{1}{10}$ of R1 and R2. For low-power single-input capacitive feedback amplifier circuits especially implemented as 2D arrays as in U.S. Pat. No. 7,728,269B2, $I_{DS1}$ and $I_{DS2}$ usually range between 1 pA and 1 µA, assuming $V_{AP}$ and $V_{AN}$ are both 10V, then R1 and R2 usually range between 5 MOhm and $5 \times 10^{12}$ Ohm.

If $I_{DS1}$ and $I_{DS2}$ are about 1 µA, then R1 and R2 are about 5 MOhm. Thus, the respective C1 and C2 constraint can be determined by the following formula, where min(R1, R2) represents the smaller of R1 and R2, and f is usually 10 GHz, which means that the switching signals S1 and S2 have rise and fall times of about 100 ps (here i stands for 1 or 2):

$$Ci > \frac{10}{2 \cdot \pi \cdot f \cdot \min(R1, R2)}$$

Therefore, if $I_{DS1}$ and $I_{DS2}$ are both about 1 µA, C1 and C2 should be at least $3.2 \times 10^{-17}$ F. If $I_{DS1}$ and $I_{DS2}$ are about 1 pA, R1 and R2 are about $5 \times 10^{12}$ Ohm. In this case, the second condition only requires C1 and C2 to be larger than $3.2 \times 10^{-23}$ F.

Overall, the above two conditions require that for low-power single-input capacitive feedback amplifier circuits with $I_{DS1}$ and $I_{DS2}$ ranging between 1 pA and 1 µA, C1 and C2 should be at least 10 fF. However, it is desirable that the above two conditions are not only met, but also exceeded to provide better charge injection cancellation performance (this is explained in more detail further below). For example, better charge injection cancellation can be achieved if Z1 and Z2 are less than $\frac{1}{100}$ of ZP1, ZP2, ZP3 as well as R1 and R2, by choosing C1 and C2 to be at least 100 fF and keeping CP1, CP2, CP3 less than 1 fF.

As a non-restricting example, assuming $V_{AP}$ and $V_{AN}$ are both 10V and f is 10 GHz, the following values can be chosen: $I_{DS1}$ is 1 nA, $I_{DS2}$ is 10 nA, so that R1 is 5 G Ohm, R2 is 500 MOhm, R1 is larger than R2; C1 and C2 are both 100 fF, so that Z1 and Z2 are both about 160 Ohm, less than $\frac{1}{1000000}$ of R1 and R2. And CP1, CP2, and CP3 are kept less than 5 fF by the layout design, so that Z1 and Z2 are 20 times smaller than ZP1, ZP2, and ZP3. C3 is 5 fF, so the ratio between C2 and C3 is 20, setting a gain of 20 for the capacitive feedback amplifier.

During the reset phase, the first MOS 1 is on and the second MOS 2 is off. If both the first MOS 1 and the second MOS 2 are of N type, then the gate of the first MOS 1 is at a high voltage (S1=VDD) and the gate of the second MOS 2 is at a low voltage (S2=GND). If both the first MOS 1 and the second MOS 2 are of P type, then the gate of the first MOS 1 is at a low voltage (S1=GND) and the gate of the second MOS 2 is at a high voltage (S2=VDD). Thus, in the reset phase, the potential of the first node T1 is driven to be equal to that of the second node T2. R1 is designed to be larger than R2, which means $I_{DS2}$ is larger than Iasi, hence the virtual ground buffer Bvg has larger driving strength and higher bandwidth than the input buffer Bi. Thus, the first node T1 and the second node T2 keep their reset level without being influenced by the input signal.

To end the reset phase, the first MOS 1 is turned off and then the second MOS 2 is turned on. If both the first MOS 1 and the second MOS 2 are of N type, then the gate of the first MOS 1 transitions from a high voltage (S1=VDD) to a low voltage (S1=GND) and then the gate of the second MOS 2 transitions from a low voltage (S2=GND) to a high voltage (S2=VDD). If both the first MOS 1 and the second MOS 2 are of P type, then the gate of the first MOS 1 transitions from a low voltage (S1=GND) to a high voltage (S1=VDD) and then the gate of the second MOS 2 transitions from a high voltage (S2=VDD) to a low voltage (S2=GND).

When the first MOS 1 transitions from on state to off state, its residual channel charge is injected into both the first node T1 and the second node T2. For the injected charge, the total impedance between the first node T1 and the small-signal ground is ZT1 and the total impedance between the second node T2 and the small-signal ground is ZT2. Because both Z1 and Z2 are much smaller than R1, R2 and each of ZP1, ZP2 and ZP3, the following relationships hold: $ZT1 \approx ZT2 \approx R1\|R2\|ZP1\|ZP2\|ZP3$.

The tolerance of the approximate equality depends on the margin by which the design exceeds the previously mentioned two conditions that determine the constraints on C1 and C2. For example, if Z1 and Z2 are about 1/10 of ZP1, ZP2, ZP3, as well as R1 and R2, ZT1 may be different from ZT2 by 10%; whereas if Z1 and Z2 are about 1/100 of ZP1, ZP2, ZP3 as well as R1 and R2, ZT1 may be different from ZT2 by only 1%.

If ZT1 and ZT2 are approximately equal as seen by the residual channel charge of the first MOS 1, approximately half of the residual channel charge of the first MOS 1 is injected into each of the first node T1 and the second node T2.

Same as shown in FIG. 8, immediately after the first MOS 1 is turned off, the second MOS 2 then transition from off state to on state. As described previously, approximately half of the residual channel charge of the first MOS 1 is injected into the second node T2. Because the second MOS 2 has half the channel area of the first MOS 1, the channel of the second MOS 2 absorbs half of the residual channel charge of the first MOS 1 during the transition of the second MOS 2 from off state to on state. Therefore, after the second MOS 2 is turned on, the charge injected into the second node T2 by the first MOS 1 is approximately fully absorbed by the second MOS 2, achieving effective charge injection cancellation on the second node T2. The bigger the margin by which the design exceeds the previously mentioned two conditions that determine the values of C1 and C2, the more effective the charge injection cancellation is.

Furthermore, because the channel width of the second MOS 2 is half of that of the first MOS 1, the total capacitance between the gate of the second MOS 2 and the second node T2, which is the sum of the gate-source capacitance and the gate-drain capacitance, approximately equals the gate-to-source (or the gate-to-drain, depending on whether the source or the drain of the first MOS 1 is connected to second node T2) capacitance between the first MOS 1 gate and the second node T2. Therefore, the clock feedthrough effect from the first MOS 1 gate signal S1 and the second MOS 2 gate signal S2 also effectively cancel each other on the second node T2.

Charge injection and clock feedthrough effects on the first node T1 are not of concern, because the first node T1 as the output of the amplifier A is driven and hence can eventually overcome the charge injection and clock feedthrough effects.

During the amplification phase, the first MOS 1 is off and the second MOS 2 is on. The second node T2 holds its signal. The output terminal T2 produces an output signal that amplifies the change in the input signal, within the bandwidth of the capacitive feedback amplifier, by a gain determined by the ratio between C2 and C3.

At the transition from the amplification phase to the reset phase, the charge injection and clock feedthrough effects on both the second node T2 and the first node T1 are not of concern, because both the second node T2 and the first node T1 are driven in the reset phase and hence can eventually overcome the charge injection and clock feedthrough effects.

REFERENCE NUMERALS 1 first metal-oxide-semiconductor field-effect transistor (first MOS)
2 second metal-oxide-semiconductor field-effect transistor (second MOS)
C1 first capacitor
C2 second capacitor
C3 third capacitor
S1 first gate signal
S2 second gate signal
T1 first node
T2 second node
T3 third node
Bi input buffer
Bvg virtual ground buffer
A amplifier
CP1, CP2, CP3 parasitic capacitances
ZP1, ZP2, ZP3 parasitic impedances

The invention claimed is:

1. A switched capacitor circuit, comprising a metal-oxide-semiconductor field-effect transistor-based switch comprising:
  a first metal-oxide semiconductor field-effect transistor having a gate, a source and a drain, wherein the source is connected to a first node and the drain is connected to a second node or wherein the drain is connected to the first node and the source is connected to the second node;
  a second metal-oxide semiconductor field-effect transistor having a gate, a source and a drain, wherein the source is connected to the drain and the source and the drain are together connected to the second node;
  a first capacitor connected between the first node and a third node; and
  a second capacitor connected between the second node and the third node, wherein said switched capacitor circuit is configured as a sample-and-hold circuit, comprising an input buffer connected to the first node and a virtual ground buffer connected to the third node, whereby the second node is configured as an output of the sample-and-hold circuit.

2. The switched capacitor circuit according to claim 1, designed such that the gate of said first metal-oxide semiconductor field-effect transistor receives a first gate signal and the gate of said second metal-oxide-semiconductor field-effect transistor receives a second gate signal, wherein the first gate signal and the second gate signal are formed such that the second metal-oxide-semiconductor field-effect transistor switches on after the first metal-oxide semiconductor field-effect transistor is switched off.

3. The switched capacitor circuit according to claim 2, designed such that there is a delay between a falling edge of the first gate signal and a rising edge of the second gate signal and/or between a rising edge of the first gate signal and a falling edge of the second gate signal.

4. The switched capacitor circuit according to claim 1, designed such that the gate of said first metal-oxide semiconductor field-effect transistor receives a first gate signal and the gate of said second metal-oxide semiconductor field-effect transistor receives a second gate signal, which is the inverted first gate signal.

5. The switched capacitor circuit according to claim 1, wherein the first metal-oxide-semiconductor field-effect transistor and the second metal-oxide-semiconductor field-effect transistor are of a same type.

6. The switched capacitor circuit according to claim 1, wherein the second metal-oxide-semiconductor field-effect transistor has a channel length, which is between 90% and 110% of a channel length of the first metal-oxide-semiconductor field-effect transistor or which is substantially equal to a channel length of the first metal-oxide-semiconductor field-effect transistor.

7. The switched capacitor circuit according to claim 1, wherein the second metal-oxide semiconductor field-effect transistor has a channel width, which is between 40% and 60% of a channel width of the first metal-oxide-semiconductor field-effect transistor or which is substantially equal to half of a channel width of the first metal-oxide-semiconductor field-effect transistor.

8. The switched capacitor circuit according to claim 1, wherein a first capacitance of said first capacitor and a second capacitance of said second capacitor are in the same order of magnitude or substantially equal.

9. The switched capacitor circuit according to claim 1, wherein said first capacitor and/or said second capacitor has a capacitance or have capacitances of at least 10 fF, 32 fF, 100 fF or 320 fF.

10. The switched capacitor circuit according to claim 1, wherein said first capacitor and/or said second capacitor has a capacitance or have capacitances of at least 5 times of a first parasitic capacitance of the first node, of a second parasitic capacitance of the second node and/or of a third parasitic capacitance of the third node.

11. The switched capacitor circuit according to claim 1, wherein said first capacitor and/or said second capacitor has a capacitance or have capacitances of at least 5 times the following value: $1/(2 \cdot \pi \cdot f \cdot R)$, wherein f is a gate signal main frequency component of a gate signal supplied to the gate of the first and/or second MOS (1, 2) and R is a small-signal output resistance of said input buffer, a small-signal output resistance of said virtual ground buffer, a or the lower value of these two small-signal output resistance values.

12. A switched capacitor circuit, comprising a metal-oxide-semiconductor field-effect transistor-based switch comprising:
a first metal-oxide-semiconductor field-effect transistor having a gate, a source and a drain, wherein the source is connected to a first node and the drain is connected to a second node or wherein the drain is connected to the first node and the source is connected to the second node;
a second metal-oxide semiconductor field-effect transistor having a gate, a source and a drain, wherein the source is connected to the drain and the source and the drain are together connected to the second node;
a first capacitor connected between the first node and a third node; and
a second capacitor connected between the second node and the third node,
wherein said switched capacitor circuit is configured as a capacitive feedback amplifier circuit, in particular for a delta modulator, comprising an input buffer connected to the third node and an amplifier and a third capacitor connected in parallel between the first node and the second node, wherein the second node is connected to the input of the amplifier and the first node is configured as an output of the capacitive feedback amplifier circuit.

13. The switched capacitor circuit according to claim 12, designed such that the gate of said first metal-oxide-semiconductor field-effect transistor receives a first gate signal and the gate of said second metal-oxide-semiconductor field-effect transistor receives a second gate signal, wherein the first gate signal and the second gate signal are formed such that the second metal-oxide-semiconductor field-effect transistor switches on after the first metal-oxide-semiconductor field-effect transistor is switched off.

14. The switched capacitor circuit according to claim 12, designed such that the gate of said first metal-oxide semiconductor field-effect transistor receives a first gate signal and the gate of said second metal-oxide-semiconductor field-effect transistor receives a second gate signal, which is the inverted first gate signal.

15. The switched capacitor circuit according to claim 12, designed such that there is a delay between a falling edge of the first gate signal and a rising edge of the second gate signal and/or between a rising edge of the first gate signal and a falling edge of the second gate signal.

16. The switched capacitor circuit according to claim 12, wherein the first metal-oxide-semiconductor field-effect transistor and the second metal-oxide-semiconductor field-effect transistor are of a same type.

17. The switched capacitor circuit according to claim 12, wherein the second metal-oxide semiconductor field-effect transistor has a channel length, which is between 90% and 110% of a channel length of the first metal-oxide-semiconductor field-effect transistor or which is substantially equal to a channel length of the first metal-oxide-semiconductor field-effect transistor.

18. The switched capacitor circuit according to claim 12, wherein the second metal-oxide-semiconductor field-effect transistor has a channel width, which is between 40% and 60% of a channel width of the first metal-oxide-semiconductor field-effect transistor or which is substantially equal to half of a channel width of the first metal-oxide-semiconductor field-effect transistor.

19. The switched capacitor circuit according to claim 12, wherein a first capacitance of said first capacitor and a second capacitance of said second capacitor are in the same order of magnitude or substantially equal.

20. The switched capacitor circuit according to claim 12, wherein said first capacitor and/or said second capacitor has a capacitance or have capacitances of at least 10 fF, 32 fF, 100 fF or 320 fF.

21. The switched capacitor circuit according to claim 12, wherein said first capacitor and/or said second capacitor has a capacitance or have capacitances of at least 5 times of a first parasitic capacitance of the first node, of a second parasitic capacitance of the second node and/or of a third parasitic capacitance of the third node.

22. The switched capacitor circuit according to claim 12, wherein said first capacitor and/or said second capacitor has a capacitance or have capacitances of at least 5 times the following value: $1/(2 \cdot \pi \cdot f \cdot R)$, wherein f is a gate signal main frequency component of a gate signal supplied to the gate of the first and/or second MOS (1, 2) and R is a small-signal output resistance of said input buffer, a small-signal output resistance of said amplifier, or the lower value of these two small-signal output resistance values.

\* \* \* \* \*